(12) United States Patent
Nagashima et al.

(10) Patent No.: US 10,548,213 B2
(45) Date of Patent: Jan. 28, 2020

(54) ELECTRONIC CONTROLLING APPARATUS

(71) Applicant: Mitsubishi Electric Corporation, Tokyo (JP)

(72) Inventors: Tomohiko Nagashima, Tokyo (JP); Yoshihito Asao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/072,999

(22) PCT Filed: Mar. 7, 2016

(86) PCT No.: PCT/JP2016/056984
§ 371 (c)(1),
(2) Date: Jul. 26, 2018

(87) PCT Pub. No.: WO2017/154075
PCT Pub. Date: Sep. 14, 2017

(65) Prior Publication Data
US 2019/0029107 A1 Jan. 24, 2019

(51) Int. Cl.
*H05K 1/02* (2006.01)
*G06F 1/18* (2006.01)
*H05K 1/11* (2006.01)

(52) U.S. Cl.
CPC ........... *H05K 1/0209* (2013.01); *G06F 1/188* (2013.01); *H05K 1/0298* (2013.01); *H05K 1/119* (2013.01);
(Continued)

(58) Field of Classification Search
CPC .... H05K 1/0209; H05K 1/119; H05K 1/0298; H05K 3/46; G06F 1/188
See application file for complete search history.

(56) References Cited

U.S. PATENT DOCUMENTS 7,696,613 B2 * 4/2010 Nakamura ........ H01L 23/49822
257/668
8,924,081 B2 * 12/2014 Sonoda ................ B62D 5/0406
180/432
(Continued)

FOREIGN PATENT DOCUMENTS

JP 57-014471 U1 1/1982
JP 60-045494 U1 3/1985
(Continued)

OTHER PUBLICATIONS

International Search Report for PCT/JP2016/056984, dated May 24, 2016.

*Primary Examiner* — Nathan Milakovich
(74) *Attorney, Agent, or Firm* — Sughrue Mion, PLLC; Richard C. Turner (57) ABSTRACT

An electronic controlling apparatus includes a circuit board in which conductor layers and insulating layers are disposed alternately. In some embodiments, thicknesses of an upper portion outer conductor layer that is disposed on a first surface of the circuit board and a lower portion outer conductor layer that is disposed on a second surface of the circuit board are identical and have greatest thickness among the conductor layers, or thicknesses of a first outermost position inner conductor layer and a second outermost position inner conductor layer that are positioned at two end portions inside the circuit board are identical and have greatest thickness among the conductor layers, and the conductor layers are disposed symmetrically so as to have a central plane in a thickness direction of the circuit board as a plane of symmetry. In some embodiments, thicknesses and arrangements of conductor layers are not symmetrical in the thickness direction of the circuit board.

11 Claims, 7 Drawing Sheets

(52) U.S. Cl.
CPC . *H05K 2201/062* (2013.01); *H05K 2201/066* (2013.01)

(56) References Cited

U.S. PATENT DOCUMENTS

| | | | |
|---|---|---|---|
| 9,900,996 B2 * | 2/2018 | Lin | H05K 3/4644 |
| 2014/0225482 A1 | 8/2014 | Hara et al. | |
| 2016/0094175 A1 * | 3/2016 | Yamasaki | H02P 29/68 |
| | | | 318/724 |

FOREIGN PATENT DOCUMENTS

| | | |
|---|---|---|
| JP | 04-334096 A | 11/1992 |
| JP | 2003-347687 A | 12/2003 |
| JP | 2012-234858 A | 11/2012 |
| JP | 2014-220429 A | 11/2014 |
| JP | 5725055 B2 | 5/2015 |
| WO | 2008/078739 A1 | 7/2008 |

\* cited by examiner

ELECTRONIC CONTROLLING APPARATUS

CROSS REFERENCE TO RELATED APPLICATIONS

This Application is a National Stage of International Application No. PCT/JP2016/056984 filed Mar. 7, 2016.

TECHNICAL FIELD

The present invention relates to an electronic controlling apparatus that has a multilayered circuit board to which a power circuit is mounted that is accompanied by heat generation in particular.

BACKGROUND ART

In electronic controlling apparatuses that are used in electric power steering apparatuses, etc., because large currents or high voltages are supplied to a power circuit that is mounted to a circuit board, the power circuit generates heat, and since this generated heat can lead to malfunction and failure of electronic components, it is desirable to radiate the heat generated in the power circuit effectively.

Thus, in conventional electronic control units in which semiconductor modules that constitute a power circuit are mounted to a circuit board by connecting metal sheets and terminals thereof to a wiring pattern that is formed on a first surface of the circuit board, heat generated in the semiconductor modules has been radiated by disposing a radiator so as to be connected to the wiring pattern by means of a thermally conductive member to transfer the heat generated in the semiconductor modules to the radiator by means of the wiring pattern and the thermally conductive member (see Patent Literature 1, for example).

However, in conventional electronic control units, because electronic components such as the semiconductor modules can only be mounted to the first surface of the circuit board, packing density of the parts is low.

In consideration of such conditions, conventional motor driving circuit boards have been proposed in which a laminated circuit portion is constituted by alternately laminating conductor layers and resin insulating layers, a metal sheet is disposed so as to contact the lowermost insulating layer, a heat-dissipating via is disposed so as to contact the uppermost insulating layer and the lowermost insulating layer on which electronic components are mounted, and heat generated in the electronic components is radiated to the metal sheet by means of the heat-dissipating via and the lowermost insulating layer (see Patent Literature 2, for example).

CITATION LIST

Patent Literature

Patent Literature 1: Japanese Patent No. 5725055 (Gazette)
Patent Literature 2: International Publication No. WO/2008/078739

SUMMARY OF THE INVENTION

Problem to be Solved by the Invention

In this manner, in conventional motor driving circuit boards, packing density of the parts can be increased because the laminated circuit portion is constituted by alternately laminating conductor layers and insulating layers. However, because the uppermost layer is a conductor layer and the lowermost layer is an insulating layer, the laminated circuit portion has an arrangement in which the arrangement of the plurality of conductor layers in a thickness direction is biased toward upper layers. Thus, one problem has been that asymmetry arises in the thermal distribution in the thickness direction of the laminated circuit portion during heat generation in the electronic components, giving rise to buckling of the circuit board.

Furthermore, in conventional motor driving circuit boards, because the thickness of each of the laminated conductor layers is constant, thermal capacity of the uppermost insulating layer on which the electronic components are mounted is reduced, degrading heat-radiating characteristics. Then, if attempts are made to increase the thickness of the uppermost insulating layer in order to improve the heat-radiating characteristics without changing the thickness of the laminated circuit portion, the arrangement of the plurality of the conductor layers in the thickness direction in the laminated circuit portion becomes even more unbalanced toward the upper layers, exacerbating problems with buckling of the circuit board.

Embodiments aim to solve the above problems and an object of these embodiments is to provide an electronic controlling apparatus that can improve heat-radiating characteristics, and that can also suppress occurrences of buckling of a multilayered circuit board.

Means for Solving the Problem

An electronic controlling apparatus according to some embodiments includes: a circuit board in which conductor layers and insulating layers are disposed alternately; a power circuit that includes a plurality of power elements that are each mounted to a first surface of the circuit board so as to be connected to an upper portion wiring pattern that is formed by an upper portion outer conductor layer that is disposed on the first surface of the circuit board among the conductor layers; and a control portion that is mounted to a second surface of the circuit board so as to be connected to a lower portion wiring pattern that is formed by a lower portion outer conductor layer that is disposed on the second surface of the circuit board among the conductor layers. Thicknesses of the upper portion outer conductor layer and the lower portion outer conductor layer are identical and have greatest thickness among the conductor layers, or thicknesses of a first outermost position inner conductor layer that is positioned at a position that is nearest to the first surface inside the circuit board and a second outermost position inner conductor layer that is positioned at a position that is nearest to the second surface among the conductor layers are identical and have greatest thickness among the conductor layers, and the conductor layers are disposed symmetrically so as to have a central plane in a thickness direction of the circuit board as a plane of symmetry.

Effects of the Invention

According to some embodiments, because the thickness of the upper portion wiring pattern to which the power elements are connected or the outermost position inner conductor layer that is adjacent to the upper portion wiring pattern is thicker, the thermal capacity of the upper portion wiring pattern or the outermost position inner conductor layer can be increased, improving heat-radiating characteristics.

Because the conductor layers are disposed symmetrically so as to have a central plane in the thickness direction of the circuit board as a plane of symmetry, the occurrence of asymmetry in thermal distribution that accompanies heat generated in the power elements is suppressed, suppressing occurrences of buckling of the circuit board.

DESCRIPTION OF EMBODIMENTS

Embodiment 1

Figure 1:
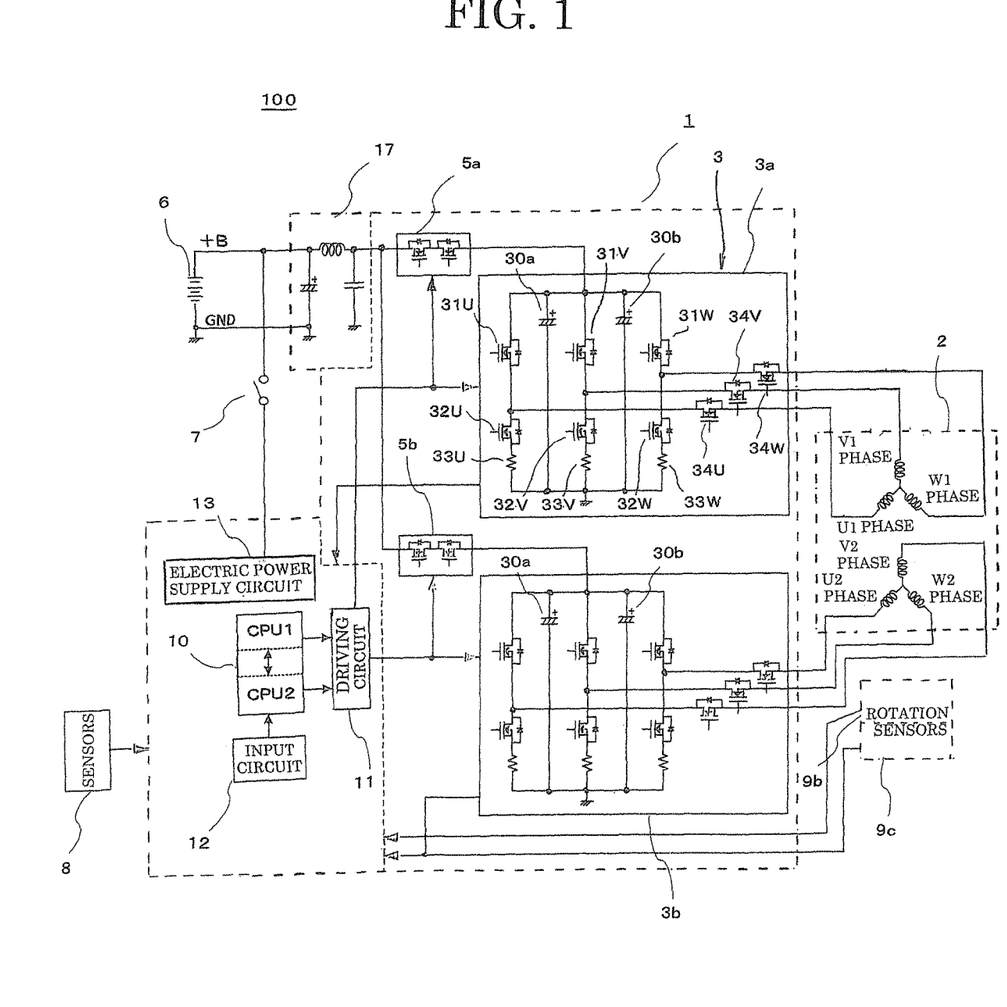
FIG. 1 is an overall circuit diagram for an electric power steering apparatus that uses an electronic controlling apparatus according to Embodiment 1 of the present invention.

FIG. 1 is an overall circuit diagram for an electric power steering apparatus that uses an electronic controlling apparatus according to Embodiment 1 of the present invention.

In FIG. 1, an electric power steering apparatus 100 includes: a motor 2; and a control unit 1 that controls driving of the motor 2. The control unit 1 corresponds to an electronic controlling apparatus that has a circuit board 4 that is equipped with a power circuit. In this case, the motor 2 will be explained as a three-phase brushless motor, but the motor may have brushes, or may be a polyphase winding motor that has three or more phases. Furthermore, the motor 2 has two sets three-phase windings, but may have a single three-phase winding.

The control unit 1 is mainly configured around a circuit board 4 to which are mounted: an inverter circuit 3 that supplies electric current to the motor 2; small-signal circuits such as an electric power supply circuit 13, an input circuit 12, a CPU 10, and a driving circuit 11; a filter 17; and electric power supplying switching elements 5a and 5b that perform a role as electric power supply relays, the control unit 1 being disposed at an opposite end of the motor 2 from an output end of an output shaft 21 and integrated with the motor 2. Rotation sensors 9b and 9c for detecting rotational angle of the motor 2 are installed in a vicinity of a non-output end portion of the output shaft 21 of the motor 2. Electric power is supplied by means of a battery 6 and an ignition switch 7 that are mounted to a vehicle, and various types of information from sensors 8 such as vehicle speed sensors, a torque sensor that detects steering torque on a steering wheel, etc., are also inputted into the control unit 1.

Next, connection relationships and operation of each of the portions in the control unit 1 will be explained.

First, when the ignition switch 7 is closed by a driver, a constant voltage is supplied to the CPU 10, the input circuit 12, and the driving circuit 11, etc., by the electric power supply circuit 13. An electric power supply for the inverter circuit 3 is supplied by means of the filter 17, which includes capacitors and a coil. Information from the sensors 8, such as the vehicle speed sensors, the torque sensor, etc., is conveyed to the CPU 10 by means of the input circuit 12, and the CPU 10 computes controlling variables that supply electric power to the motor 2 based on this information, these controlling variables being outputted by means of the driving circuit 11. Respective information such as voltage or electric current from respective portions inside the inverter circuit 3, rotational angle that is detected by the rotation sensor 9b and 9c, etc., is also conveyed to the CPU 10 by means of the input circuit 12.

The electric power supplying switching elements 5a and 5b, which have a relay function that opens and closes a +B line (hereafter "electric power supply line"), are also inserted into the electric power supply line. These electric power supplying switching elements 5a and 5b are field-effect transistors (FETs), for example, and two parasitic diodes, one in a forward direction and one in a reverse direction relative to the electric current supply, are disposed in series. These electric power supplying switching elements 5a and 5b can forcibly shut off the electric power supply if a failure arises in the inverter circuit 3 or the motor 2, for example. In addition, if the battery is connected in reverse, the parasitic diodes can shut off the line through which the electric current flows, thereby also serving a role of battery reverse connection protection. The CPU 10 also controls driving of these electric power supplying switching elements 5a and 5b by means of the driving circuit 11.

The inverter circuit 3 has first and second inverter circuits 3a and 3b that have identical circuit configurations that supply electric power to each of two sets of three-phase windings (a U phase, a V phase, and a W phase) of the motor 2. The first inverter circuit 3a includes a circuit portion that includes three switching elements and capacitors for each of the phases (a U1 phase, a V1 phase, and a W1 phase) of a three-phase winding.

The circuit portion for the U1 phase includes: an upper arm switching element 31U; a lower arm switching element 32U; and a relay switching element 34U that has a relay function that opens and closes between a connecting point between the upper and lower arm switching elements 31U and 32U and the U1-phase winding. A shunt resistor 33U is also connected in series with the upper and lower arm switching elements 31U and 32U in order to detect the electric current that flows to the motor 2.

The circuit portion for the V1 phase includes: an upper arm switching element 31V; a lower arm switching element 32V; and a relay switching element 34V that has a relay function that opens and closes between a connecting point between the upper and lower arm switching elements 31V and 32V and the V1-phase winding. A shunt resistor 33V is also connected in series with the upper and lower arm switching elements 31V and 32V.

The circuit portion for the W1 phase includes: an upper arm switching element 31W; a lower arm switching element 32W; and a relay switching element 34W that has a relay function that opens and closes between a connecting point between the upper and lower arm switching elements 31W and 32W and the W1-phase winding. A shunt resistor 33W is also connected in series with the upper and lower arm switching elements 31W and 32W.

Because the upper and lower arm switching elements 31U, 31V, 31W, 32U, 32V, and 32W are driven using pulse-width modulation (PWM) based on commands from the CPU 10, capacitors 30a and 30b are connected in parallel to the upper and lower arm switching elements 31U, 31V, 31W, 32U, 32V, and 32W for purposes of noise suppression.

The second inverter circuit 3b includes a circuit portion that includes three switching elements and capacitors for each of the phases (a U2 phase, a V2 phase, and a W2 phase) of a three-phase winding. Moreover, because the second inverter circuit 3b is configured in a similar or identical manner to that of the first inverter circuit 3a, explanation thereof will be omitted.

By inputting terminal voltages of connecting points between the upper and lower arm switching elements, or between the three-phase windings, and the voltages of the shunt resistors, the CPU 10 ascertains differences between actual electric current and voltage values and controlling command values (target values), also called "feedback control", and also performs failure determination for respective portions. The rotational angles that are detected by the rotation sensors 9b and 9c are inputted into the CPU 10 to calculate the rotational position or speed of the motor 2, which is used to control the electric current supply to the coils. The CPU 10 is constituted by a CPU 1 and a CPU 2 that are respectively dedicated to the first and second inverter circuits 3a and 3b, but may be constituted by a single CPU for both the first and second inverter circuits 3a and 3b. In addition, the driving circuit 11, the input circuit 12, and the electric power supply circuit 13 are configured into one set for both the CPU1 and CPU2, but may alternatively be configured such that two sets that each include a driving circuit 11, an input circuit 12, an electric power supply circuit 13 exist independently.

Here, because the inverter circuit 3 and the electric power supplying switching elements 5a and 5b control large currents, they correspond to a power circuit. The CPU 10, the driving circuit 11, the input circuit 12, and the electric power supply circuit 13, on the other hand, correspond to a control portion.

Figure 2:
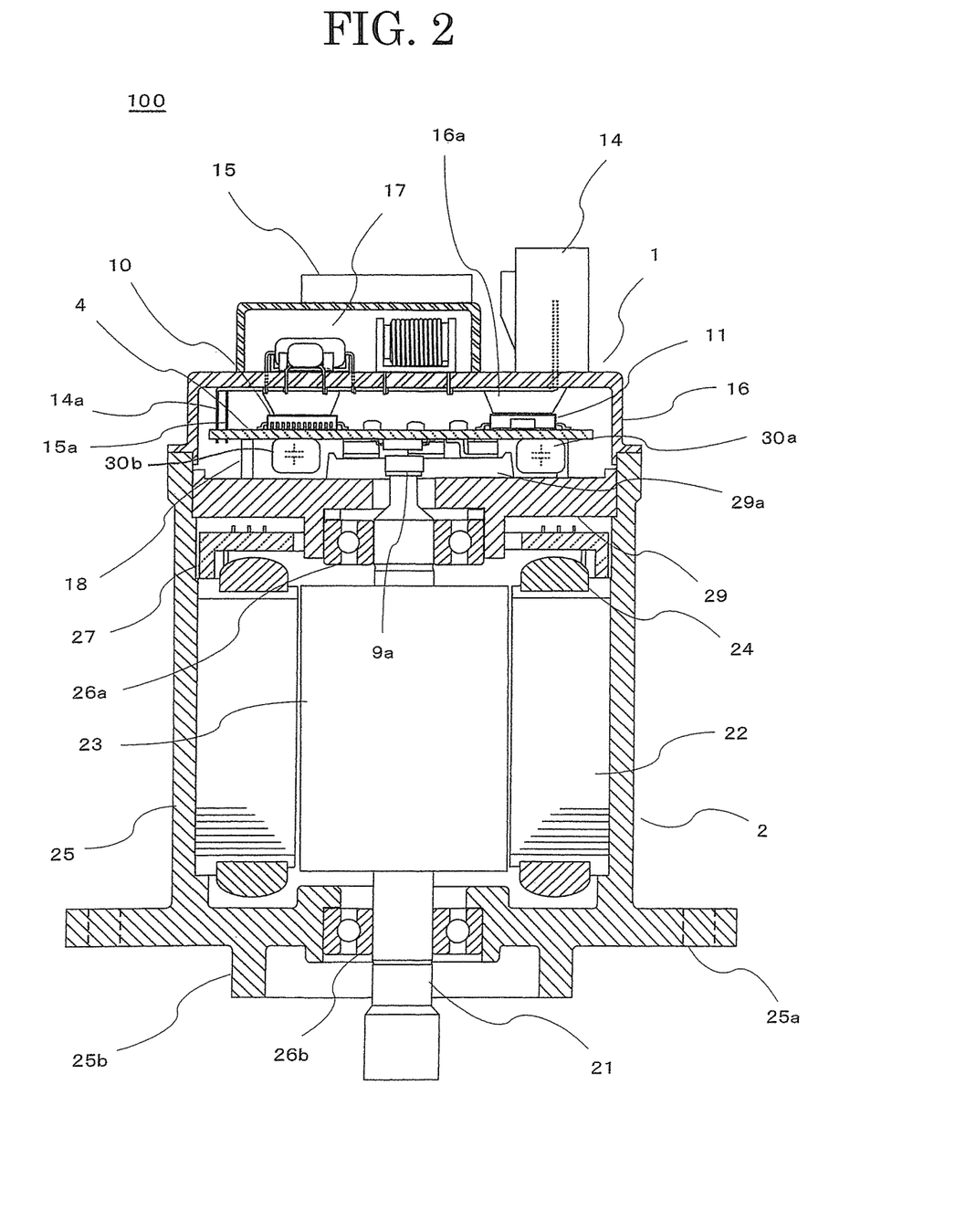
FIG. 2 is a cross section that shows the electric power steering apparatus that uses the electronic controlling apparatus according to Embodiment 1 of the present invention.

Next, construction of the electric power steering apparatus 100 will be explained. FIG. 2 is a cross section that shows the electric power steering apparatus that uses the electronic controlling apparatus according to Embodiment 1 of the present invention.

The electric power steering apparatus 100 is configured by integrating the control unit 1 and the motor 2 such that the control unit 1 is disposed on an upper portion of the motor 2 so as to be coaxial to the output shaft 21. The motor 2 is mounted internally into a motor case 25. This motor case 25 is made of a metal such that a mounting flange 25a and a connecting portion 25b that connects with a reduction gear (not shown) are integrated therein. A penetrating aperture that allows passage of the output shaft 21 is formed at a central axial position of the mounting flange 25a of the motor case 25, and a first bearing 26b is mounted into that penetrating aperture.

The motor 2 includes: a rotor 23 that is fixed to the output shaft 21, which is inserted centrally, and on an outer circumferential surface of which a plurality of pole pairs of permanent magnets (not shown) are disposed; and a stator 22 that is disposed circumferentially outside this rotor 23 coaxially so as to have a gap interposed, the stator 22 having a winding 24. An annular connecting ring 27 is produced by insert-molding electrical wiring busbars into an insulating resin, and is disposed on an upper portion of the stator 22 so as to be in close proximity to the winding 24. Winding ends of a plurality of windings that constitute the winding 24 are connected to the busbars of the connecting ring 27 to form two sets of three-phase windings that are wye-connected, as shown in FIG. 1. Output wires (not shown) for each of the phases, i.e., six output wires, that protrude from the connecting ring 27 extend toward the control unit 1. A rotation sensor rotor 9a is mounted to a non-output tip of the output shaft 21.

A disk-shaped frame 29 is mounted to an uppermost portion of the motor case 25 in a state of internal contact. This frame 29 is also made of a metal, a penetrating aperture that allows passage of the output shaft 21 is formed on a central position thereof, and a second bearing 26a is mounted into that penetrating aperture. The frame 29 serves a plurality of roles such as a partitioning wall that separates the motor 2 and the control unit 1, a bearing holder, etc. There are also penetrating apertures in the frame 29 for passage of the six output wires. In addition, the frame 29 also serves a role as a heatsink for radiating heat from the control unit 1. Because the frame 29 is made to serve a large number of functions in this manner, the number of parts can be reduced.

In the above manner, the motor has a construction that is enveloped in the motor case 25 as far as the first and second bearings 26a and 26b, and can be assembled separately from the control unit 1. Thus, the electric power steering apparatus 100 can be assembled by assembling the control unit 1 and the motor 2 separately, and then integrating the two.

Next, configuration of the control unit 1 will be explained. Here, to facilitate explanation, numbering that is applied to the electric power supplying switching elements, the capacitors, the upper arm switching elements, the lower arm switching elements, and the relay switching elements will be 5, 30, 31, 32, and 34.

The control unit 1 includes: the frame 29; a housing 16; and the circuit board 4, which is housed in a space that is surrounded by the frame 29 and the housing 16, and onto which the respective electronic components are mounted. The CPU 10, the driving circuit 11, the input circuit 12, the electric power supply circuit 13, the electric power supplying switching elements 5, and the inverter circuit 3, etc., which are shown in FIG. 1, are disposed so as to be distributed on two surfaces of the circuit board 4. A protruding portion 29a that functions as a heat-radiating portion is formed on the frame 29 by making a portion of an upper surface thereof protrude. Upper surfaces of various heat-generating parts such as the switching elements 5, 31, 32, and 34 contact the protruding portions 29a so as to have electrically insulating heat-radiating sheets interposed, and heat generated in heat-generating parts is radiated to the protruding portions 29a. In this case, the frame 29 functions as a first heatsink.

The housing 16 is made of a resin, for example, is produced so as to have a floored cylindrical shape, and is attached to the motor case 25 by mounting an opening edge portion by press-fitting, etc., onto the uppermost portion of the cylindrical portion of the motor case 25. At least two connectors 14 and 15 are formed integrally on a floor portion of the housing 16. The connector 14 is for a large-current electric power supply (+B and ground), and the connector 15 is for sensors. Connector pins are insert-molded into these connectors 14 and 15, first ends thereof being connected to vehicle wiring harnesses outside the control unit 1, and second ends extending to inner wall surfaces of the housing 16. There are at least two conductors 14a, which constitute electrical wiring, being for +B and for ground, respectively. There are several conductors 15a, on the other hand, which are for sensors, and these are extended downward in FIG. 2 so as to pass out through an inner wall in a floor portion of the housing 16, and tip portions thereof are passed through apertures in the circuit board 4, and are electrically connected to a wiring pattern of the circuit board 4 that is intended for connection therewith. The capacitors 30 of the inverter circuit 3 are mounted to a lower surface of the circuit board 4 in FIG. 2, so as to be disposed between the circuit board 4 and the frame 29.

The filter 17 (coils and capacitors) is mounted in a vicinity of the connector 14. The filter 17 is disposed partway along the conductors 14a of the connector 14 that extend from the connector pins, and leg portions of respective parts are connected to the conductors 14a. Portions of an inner wall surface on the floor portion of the housing 16 are made to protrude to form projecting portions 16a that function as heat-radiating portions. The CPU 10 and the driving circuit 11 that are mounted to the circuit board 4 contact the projecting portions 16a so as to have electrically insulating heat-radiating sheets 16b interposed, and heat generated in the CPU 10 and the driving circuit 11 is radiated to the heat-radiating portions 16a. In this case, the housing 16 functions as a second heatsink. Moreover, the circuit board 4 is fixed to the frame 29 by posts 18.

Figure 3:
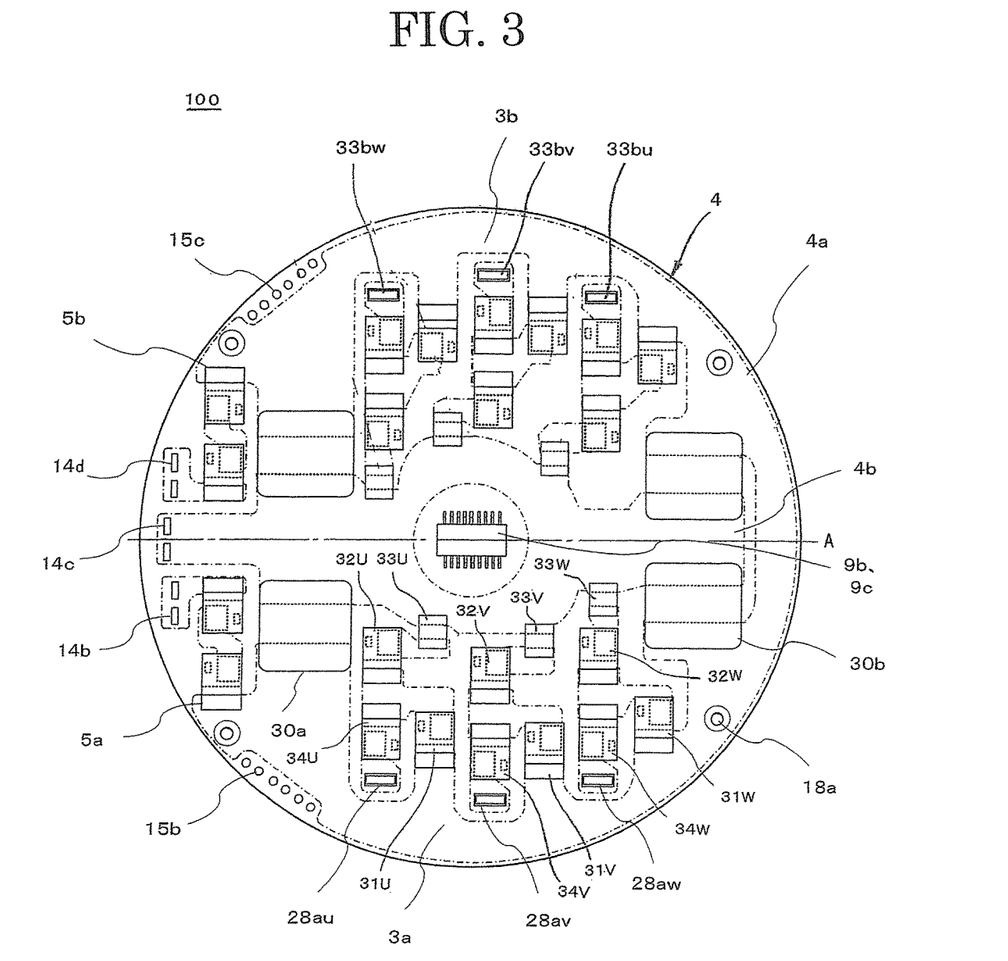
FIG. 3 is a plan that shows a circuit board in the electronic controlling apparatus according to Embodiment 1 of the present invention that is viewed from a side near a motor.

Next, configuration of the circuit board 4, and arrangement and connection of the respective parts will be explained with reference to FIGS. 3 and 4. FIG. 3 is a plan that shows a circuit board in the electronic controlling apparatus according to Embodiment 1 of the present invention that is viewed from a side near a motor, and FIG. 4 is a side elevation that shows the circuit board in the electronic controlling apparatus according to Embodiment 1 of the present invention.

Figure 4:
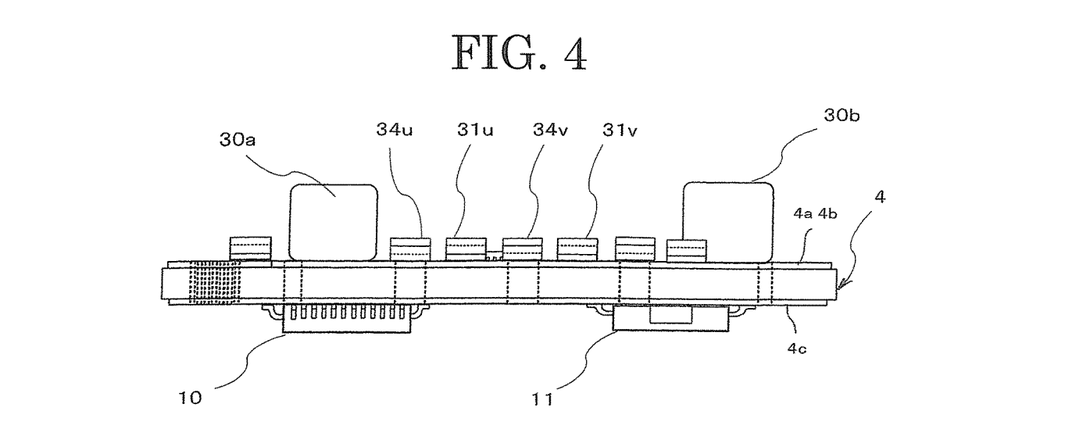
FIG. 4 is a side elevation that shows the circuit board in the electronic controlling apparatus according to Embodiment 1 of the present invention.

In FIGS. 3 and 4, the control portion, which includes the CPU 10, the driving circuit 11, the input circuit 12, and the electric power supply circuit 13, is connected to a lower portion wiring pattern 4c that is formed on a rear surface of the circuit board 4, and is mounted so as to be distributed over the entire rear surface. The power circuit is mounted to a front surface of the circuit board 4. Since a large current flows through the power circuit and generates heat, the construction thereof must take heat-radiating characteristics into consideration.

The first and second inverter circuits 3a and 3b have identical circuitry. Thus, groups of parts that constitute the first and second inverter circuits 3a and 3b are divided into an upper half and a lower half of the front surface of the circuit board 4 in FIG. 3, and are disposed so as to be distributed uniformly so as to be spaced apart from each other. In addition, the groups of parts that constitute the first and second inverter circuits 3a and 3b are disposed approximately symmetrically so as to have a line segment A that divides the upper half and the lower half of the front surface of the circuit board 4 in FIG. 3 as an axis of symmetry. Because the switching elements 31, 32, and 34, which constitute heat-generating parts, are distributed and disposed approximately symmetrically so as to be spaced apart from each other so as to have the line segment A that divides the upper half and the lower half of the front surface of the circuit board 4 as an axis of symmetry in this manner, asymmetry in the thermal distribution of the first and second inverter circuits 3a and 3b is suppressed.

The electric power supplying switching elements 5 are similarly disposed symmetrically on the front surface of the circuit board 4 so as to have the line segment A as an axis of symmetry. The capacitors 30a and 30b are also disposed symmetrically on the front surface of the circuit board 4 so as to have the line segment A as an axis of symmetry. In addition, wiring for connections among the respective parts is also laid out approximately symmetrically so as to have the line segment A as an axis of symmetry. Furthermore, in consideration of current flow, positive terminals 14b and 14d that constitute electric power supply terminals and a negative terminal 14c that constitutes a ground terminal are all disposed at a left edge of the circuit board 4 in FIG. 3. The +B conductor 14a is connected to the positive terminals 14b and 14d, and a ground conductor 14a is connected to the negative terminal 14c. Electric power supply wiring patterns 4a that are connected to the positive terminals 14b and 14d by means of the electric power supplying switching elements 5, and a ground wiring pattern 4b that is connected to the negative terminal 14c, can thereby be wired parallel to each other in thick, short patterns. The electric power supply wiring patterns 4a are also formed into symmetrical patterns so as to have the line segment A as an axis of symmetry. Here, the electric power supply wiring patterns 4a and the ground wiring pattern 4b constitute an upper portion wiring pattern.

The power elements that mainly constitute the power circuit include twenty-two switching elements 5, 31, 32, and 34, and six shunt resistors 33U, 33V, and 33W. The sensor conductors 15a are divided into two sets, and are inserted into and connected to through-holes 15b and 15c that are formed on a perimeter portion of the circuit board 4. Six through-holes 28au, 28av, and 28aw are for connection to the winding 24 of the motor 2. Moreover, an integrated circuits (IC) that is disposed centrally on the front surface of the circuit board 4 has the rotation sensors 9b and 9c mounted internally therein.

Four apertures 18a that are formed so as to be distributed circumferentially around a vicinity of an edge portion of the circuit board 4 constitute insertion apertures for the posts 18, which are shown in FIG. 2. The circuit board 4 is fixed to the frame 29 such that the surface on which the first and second inverter circuits 3a and 3b are mounted faces toward the frame 29 using the posts 18, which are inserted into the apertures 18a. In addition, the circuit board 4 itself is fixed to the housing 16 by arranging the large number of conductors 15a distributively. Not only vibration of the circuit board 4 that results from vibration of the electric power steering apparatus 100, but also the occurrence of buckling and the occurrence of tilting of the circuit board 4 the circuit board itself can thereby be suppressed.

Figure 5:
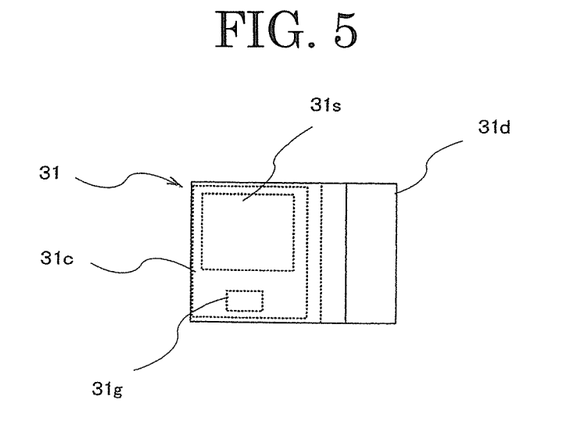
FIG. 5 is a top plan that shows an upper arm switching element that is used in the electronic controlling apparatus according to Embodiment 1 of the present invention.
Figure 6:
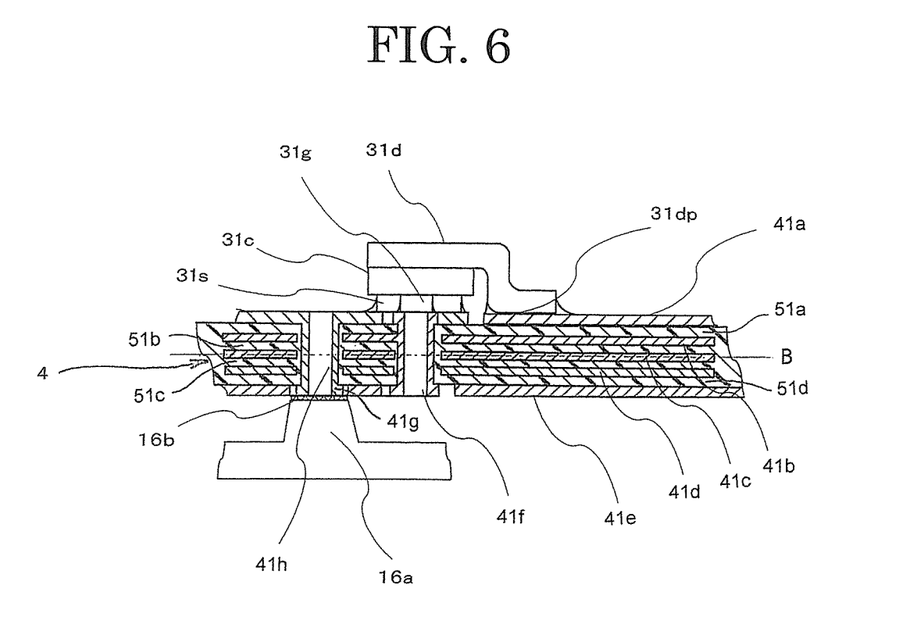
FIG. 6 is a partial cross section that shows a vicinity of the circuit board in the electronic controlling apparatus according to Embodiment 1 of the present invention.

Next, construction of the switching elements 31 and the circuit board 4, being representative of heat-generating parts, will be explained based on FIGS. 5 and 6. FIG. 5 is a top plan that shows an upper arm switching element that is used in the electronic controlling apparatus according to Embodiment 1 of the present invention, and FIG. 6 is a partial cross section that shows a vicinity of the circuit board in the electronic controlling apparatus according to Embodiment 1 of the present invention. Moreover, in FIG. 6, only the circuit board is represented in cross section.

The switching elements 31 are semiconductor switches, such as metal oxide semiconductor field-effect transistors (MOSFETs), for example. As shown in FIG. 5, the chip 31c of the switching element 31 is mounted to a copper plate 31d, for example, a drain terminal being connected directly to the plate 31d. Thus, the plate 31d is the drain terminal 31d of the switching element 31. The source terminal 31s and the gate terminal 31g, on the other hand, are led out lower down than the chip 31c. Lower surfaces of the source terminal 31s and the gate terminal 31g and a lowermost surface 31dp of the plate 31d form a common plane.

The circuit board 4 is a multilayered circuit board that is configured by alternately laminating conductor layers 41a, 41b, 41c, 41d, and 41e and insulating layers 51a, 51b, 51c, and 51d. The conductor layers 41b, 41c, 41d, and 41e are formed using a metal that has good thermal conductivity, such as copper, for example, and the insulating layers 51a, 51b, 51c, and 51d are formed using a composite of glass fiber and epoxy resin, for example. Here, the conductor layer 41a is formed on the front surface of the circuit board 4, the conductor layers 41b, 41c, and 41d are formed inside the circuit board 4, and the conductor layer 41e is formed on the rear surface of the circuit board 4. The conductor layer 41a is patterned into the electric power supply wiring patterns 4a and the ground wiring pattern 4b. The conductor layers 41b, 41c, 41d, and 41e are also patterned into desired wiring patterns. The wiring patterns that are formed by the conductor layers 41a, 41b, 41c, 41d, and 41e are electrically connected by through-holes. Moreover, the conductor layer 41a constitutes an upper portion outer conductor layer, and the conductor layer 41e constitutes a lower portion outer conductor layer. The conductor layer 41b constitutes a first outermost position inner conductor layer, and the conductor layer 41d constitutes a second outermost position inner conductor layer. The lower portion wiring pattern 4c is formed by the conductor layer 41e.

As shown in FIG. 6, lowermost surfaces of the gate terminal 31g and the source terminal 31s are electrically connected by soldering, etc., to contact pads or wiring patterns that are formed by the conductor layer 41a. The lowermost surface 31dp of the drain terminal 31d is also similarly electrically connected by soldering, etc., to a wiring pattern that is formed by the conductor layer 41a. The gate terminal 31g is connected to a through-hole 41f and is connected to the driving circuit 11 by means of the wiring patterns that are formed by the conductor layer 41b. The wiring pattern to which the source terminal 31s is connected is connected by means of a through-hole 41h to a heat-radiating pad 41g that is formed by the conductor layer 41e. The heat-radiating pad 41g contacts the projecting portion 16a so as to have an electrically insulating heat-radiating sheet 16b interposed. The heat generated in the switching element 31 is thereby radiated to the housing 16 by means of the source terminal 31s.

Furthermore, due to pulse-width modulation (PWM) control by the switching elements 31, switching noise must be taken into consideration. In order to suppress the affect such noise has on parts such as the CPU 10 that are mounted to the upper surface of the circuit board 4, it is also possible to make the wiring pattern that is formed by the conductor layer 41b that is close to the switching elements 31 into a ground plate. Isolation from the switching elements 31 can thereby be achieved, enabling noise radiation to be suppressed. Similarly, in order to suppress noise in the signal lines to the CPU 10, it is also possible to make the wiring pattern that is formed by the conductor layer 41d into a ground plate, and to pass the signal lines through to the wiring pattern that is formed by the conductor layer 41c, provided that a multilayered circuit board is used.

According to Embodiment 1, the conductor layers 41a and 41e that are disposed on upper and lower surfaces of the circuit board 4 have identical thicknesses, and the conductor layers 41b, 41c, and 41d that are disposed inside have identical thicknesses that are thinner than those of the conductor layers 41a and 41e. The thicknesses and arrangements of the conductor layers 41a, 41b, 41c, 41d, and 41e are symmetrical in the thickness direction of the circuit board 4 so as to have a central plane in the thickness direction of the circuit board 4 as a plane of symmetry. Increases in thickness of the circuit board 4 are thereby suppressed, and the occurrence of buckling of the circuit board 4 itself can be suppressed. Asymmetry in thermal distribution in the thickness direction of the circuit board 4 that results from heat generated in heat-generating parts is also suppressed, enabling the occurrence of buckling of the circuit board 4 to be prevented.

Because the conductor layer 41a that has greatest thickness forms electric power supply wiring patterns 4a and a ground wiring pattern 4b, thermal capacity of the electric power supply wiring patterns 4a and the ground wiring pattern 4b can be increased, improving heat-radiating characteristics.

Because upper surfaces of switching elements 5, 31, 32, and 34, which are heat-generating parts, each contact protruding portions 29a of a frame 29 so as to have an electrically insulating heat-radiating sheet interposed, heat generated in the switching elements 5, 31, 32, and 34 is radiated to the frame 29 effectively. Because the frame 29 is disposed so as to be spaced apart from the circuit board 4, the effective area on the circuit board 4 for component mounting can be increased.

The first and second inverter circuits 3a and 3b and the electric power supplying switching elements 5 are divided onto two opposite sides of a line segment A that divides the front surface of the circuit board 4 uniformly in two, and are disposed symmetrically on the front surface of the circuit board 4 so as to have the line segment A as an axis of symmetry. The first and second inverter circuits 3a and 3b and the electric power supplying switching elements 5 are thereby disposed so as to generate approximately equal heat in each of the regions that divides the front surface of the circuit board 4 uniformly in two. In addition, parts including the first and second inverter circuits 3a and 3b and the electric power supplying switching elements 5 are disposed symmetrically in each of the regions that divides the front surface of the circuit board 4 uniformly in two so as to have the line segment A that divides the front surface of the circuit board 4 uniformly in two as an axis of symmetry. Thus, the occurrence of asymmetry in the thermal distribution that results from the heat generated in heat-generating parts including the first and second inverter circuits 3a and 3b and the electric power supplying switching elements 5 is suppressed.

The CPU 10 outputs controlling variable commands to the first and second inverter circuits 3a and 3b so as to be identical. That is, rather than outputting controlling variable commands so as to pass a larger current to the first inverter circuit 3a than to the second inverter circuit 3b, for example, the CPU 10 outputs controlling variable commands for passage of approximately equal electric currents. The occurrence of asymmetry in the thermal distribution that results from the heat generated in heat-generating parts including the first and second inverter circuits 3a and 3b and the electric power supplying switching elements 5 is thereby suppressed.

The CPU 10, the driving circuit 11, the input circuit 12, and the electric power supply circuit 13, which constitute a control portion, are disposed so as to be spaced apart from each other, and so as to be distributed uniformly over the entire surface of the rear surface of the circuit board 4. Thus, occurrences of asymmetry in thermal distribution that result from heat generated in heat-generating parts that include the CPU 10, the driving circuit 11, the input circuit 12, and the electric power supply circuit 13 is suppressed. Moreover, "uniformly distributed arrangement" of the control portion in this case means disposing the respective parts of the control portion so as to be divided into two according to heat-generating capacity such that approximately equal heat is generated in each group, for example.

Embodiment 2

Figure 7:
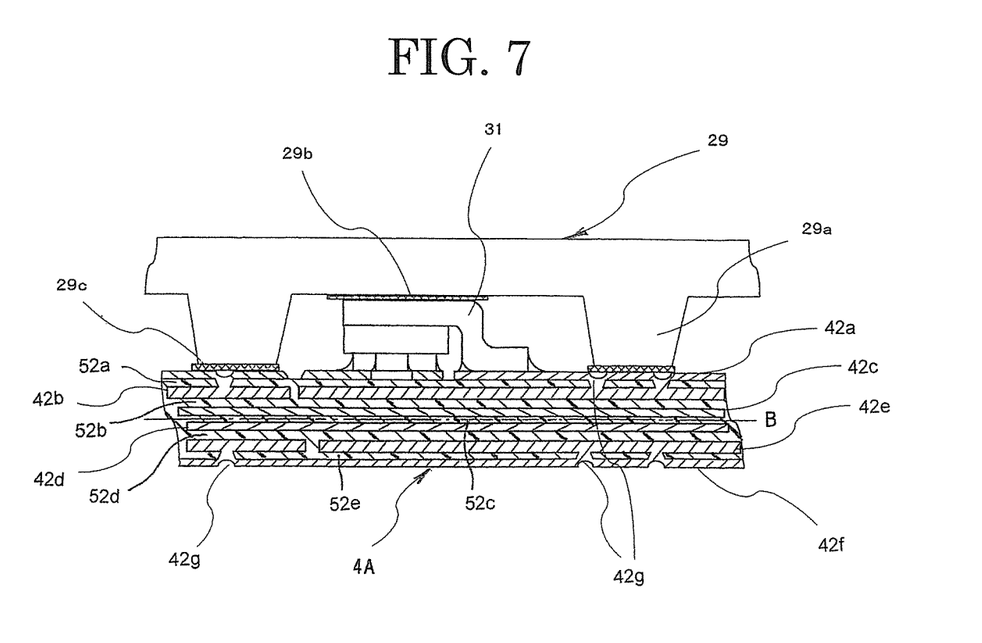
FIG. 7 is a partial cross section that shows a vicinity of a circuit board in an electronic controlling apparatus according to Embodiment 2 of the present invention.

FIG. 7 is a partial cross section that shows a vicinity of a circuit board in an electronic controlling apparatus according to Embodiment 2 of the present invention. Moreover, in FIG. 7, only a circuit board is represented in cross section.

In FIG. 7, a switching element 31 is mounted to a front surface of a circuit board 4A so as to be connected to an upper portion wiring pattern that is formed by a conductor layer 42a in which a drain terminal, a source terminal, and a gate terminal are disposed on the front surface of the circuit board 4A. A frame 29 contacts an upper surface of the switching element 31 so as to have an electrically insulating heat-radiating sheet 29b interposed, and protruding portions 29a also contact the upper portion wiring pattern that is formed by the conductor layer 42a that is disposed on the front surface of the circuit board 4A so as to have electrically insulating heat-radiating sheets 29c interposed. The wiring resistance of this upper portion wiring pattern is extremely small, but generates heat because large currents flow therethrough. Thus, the heat generated in the upper portion wiring pattern is made to radiate to the protruding portions 29a by means of the electrically insulating heat-radiating sheets 29c.

The circuit board 4A is a multilayered circuit board that is configured by alternately laminating conductor layers 42a, 42b, 42c, 42d, 42e, and 42f and insulating layers 52a, 52b, 52c, 52d, and 52e. The conductor layers 42a, 42b, 42c, 42d, 42e, and 42f are formed using a metal that has good thermal conductivity, such as copper, for example, and the insulating layers 52a, 52b, 52c, 52d, and 52e are formed using a composite of glass fiber and epoxy resin, for example. Here, the conductor layer 42a is formed on the front surface of the circuit board 4A, the conductor layers 42b, 42c, 42d, and 42e are formed inside the circuit board 4A, and the conductor layer 41f is formed on the rear surface of the circuit board 4A. The conductor layer 42a is patterned into electric power supply wiring patterns 4a and a ground wiring pattern 4b, which constitute an upper portion wiring pattern. The conductor layers 42b, 42c, 42dc, 42e, and 42f are also patterned into desired wiring patterns. The wiring patterns that are formed by the conductor layers 42a, 42b, 42c, 42d, 42e, and 42f are electrically connected by through-holes. Moreover, the conductor layer 42a constitutes an upper portion outer conductor layer, and the conductor layer 42f constitutes a lower portion outer conductor layer. The conductor layer 42b constitutes a first outermost position inner conductor layer, and the conductor layer 42e constitutes a second outermost position inner conductor layer. The lower portion wiring pattern 4c is formed by the conductor layer 42f.

The conductor layers 42b and 42e that are disposed at an outermost position of an internal portion of the circuit board 4A have identical thicknesses, and the conductor layers 42a, 42c, 42d, and 42f have identical thicknesses that are thinner than those of the conductor layers 42b and 42e. The thicknesses and arrangements of the conductor layers 42a, 42b, 42c, 42d, 42e, and 42f are symmetrical in the thickness direction of the circuit board 4A so as to have a central plane B in the thickness direction of the circuit board 4A as a plane of symmetry.

The conductor layers 42a and 42b are connected by vias 42g. In addition, a thermally conductive member fills the vias 42g. Specifically, the vias 42g are filled by the thermally conductive member by depositing copper in the vias 42g, as in via-fill plating. In FIG. 7, the state in which the thermally conductive member fills the vias 42g is represented by the surface of the vias 42g having a circular arc-shaped concave surface.

Here, a switching element 31 has been explained as an example, but the switching elements 5, 32 and 34 are also mounted to the circuit board 4A in a similar manner.

Moreover, a remainder of the configuration is configured in a similar or identical manner to that of Embodiment 1 above.

In Embodiment 2, because thicknesses and arrangements of conductor layers 42a, 42b, 42c, 42d, 42e, and 42f are also symmetrical in a thickness direction of the circuit board 4A so as to have a central plane B in the thickness direction of the circuit board 4A as a plane of symmetry, similar effects to those in Embodiment 1 above can be achieved.

In Embodiment 2, because the thicknesses of the conductor layers 42b and 42e that are positioned at the outermost positions of the internal portion of the circuit board 4A are thicker, heat-radiating characteristics are reduced compared to the circuit board 4 in Embodiment 1 above. Thus, the conductor layers 42b and 42e are thermally connected to the conductor layers 42a and 42f, which are disposed on the two surfaces of the circuit board 4A by forming the vias 42g, ensuring the heat-radiating characteristics that are equal to those of the circuit board 4.

Because the thermally conductive member fills the vias 42g, heat-radiating characteristics of the circuit board 4A can be improved. Because the conductor layers 42a, 42b, 42e, and 42f, the vias 42g, and the thermally conductive member are produced using copper, thermal resistance and electrical resistance can be reduced.

Here, because the thickness of the lower portion wiring pattern that is formed by the conductor layer 42f onto which the control portion is mounted is thicker, more electric current can be passed compared to the signal lines by using this as the electric power supply system for the control portion. Furthermore, because the conductor layer 42f that forms the negative-side ground wiring pattern in the control portion is different than the conductor layer 42a that forms the negative-side ground wiring pattern in the power circuit, the large current on the power circuit side is less likely to flow onto the control portion side, enabling the electric potential differences to be reduced. It is possible to use not only the +B 12-volt system but also constant electric power supplies such as 5-volt systems, for example, as the positive-side electric power supply system. In a 5-volt constant electric power supply in particular, because the width of the wiring patterns can be made relatively slender so as to allow for the electric current capacity of the electric power supply system without needing to be thickened unnecessarily, the propagation of noise from the wiring patterns of the electric power supply system, which contains noise components, to other layers can be suppressed.

Because the frame 29, which functions as a heatsink, is made to contact not only heat-generating parts but also the upper portion wiring pattern thermally, heat-radiating characteristics can be further improved. Temperature deviations are thereby further suppressed, making it possible to prevent the occurrence of buckling of the circuit board 4A due to temperature.

Embodiment 3

Figure 8:
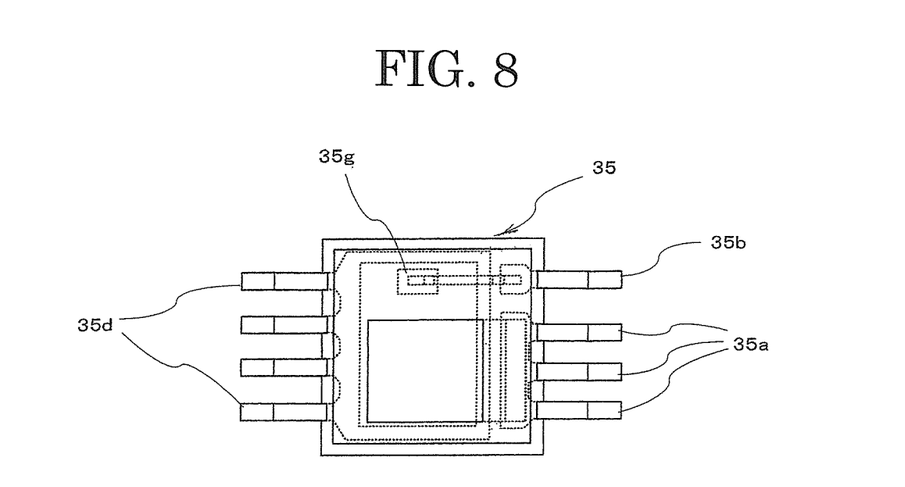
FIG. 8 is a top plan that shows a switching element in an electronic controlling apparatus according to Embodiment 3 of the present invention.
Figure 9:
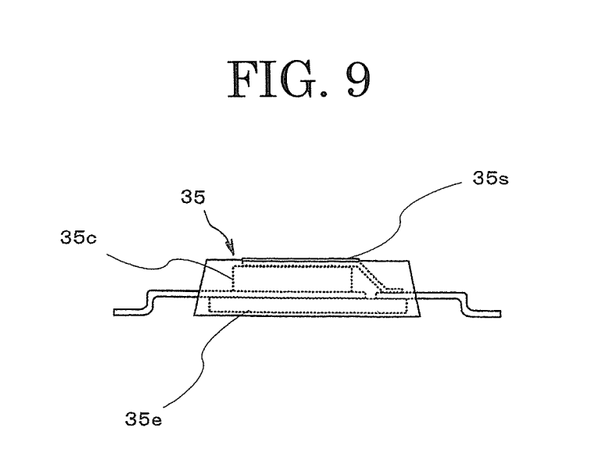
FIG. 9 is a side elevation that shows the switching element in an electronic controlling apparatus according to Embodiment 3 of the present invention.

FIG. 8 is a top plan that shows a switching element in an electronic controlling apparatus according to Embodiment 3 of the present invention, and FIG. 9 is a side elevation that shows the switching element in an electronic controlling apparatus according to Embodiment 3 of the present invention.

In FIGS. 8 and 9, a switching element 35 has a different construction than the switching element 31, having a construction that has an external appearance of an 8-pin molded integrated circuit (IC). Four pins each protrude to the left and right in the figure, the four pins 35d on the left all being for drain electrodes of a field-effect transistor (FET), three of the pins 35a on the right being for a source electrode, and one 35b being for a gate electrode. A lead frame that is connected to the drain electrode pins 35d is mounted onto a base portion 35e so as to have an insulating layer (not shown) interposed, and a chip 35c is mounted to the frame. An upper surface of the chip 35c is a source 35s, and a portion of the source 35s is exposed through a mold main body. The source 35s is connected to the source electrode pins 35a by means of connecting inner leads. The gate electrode pin 35b is connected to a gate portion 35g that is disposed on an end of the chip 35c. A plurality of pins are used as the source electrode pins 35a and the drain electrode pins 35d so as to pass large currents. A single pin is used as the gate electrode pin 35b since it is a signal line.

Embodiment 3 is configured in a similar or identical manner to Embodiment 2 above except that switching elements 35 that have a different construction are used in the switching elements 5, 31, 32, and 34.

In the switching elements 35 that are configured in this manner, a base portion 35e and a source 35s constitute heat-radiating regions for generated heat. Because the upper surface of the switching elements 35, that is, the source 35s, contacts the frame 29 so as to have an electrically insulating heat-radiating sheet 29b interposed in a similar or identical manner to Embodiment 2, heat generated in the switching elements 35 is radiated to the frame 29. A lower surface of the base portion 35e may be covered in a molded resin, or may be exposed. If the lower surface of the base portion 35e contacts the upper portion wiring pattern of the circuit board 4A, heat-radiating characteristics can be improved. If protruding portions 29a are also placed in contact with this upper portion wiring pattern, heat-radiating characteristics can be further improved.

Thus, if the upper surfaces of the heat-generating parts are flat, heat-radiating characteristics can be improved by being placed in contact with the frame 29, which functions as a first heatsink. Furthermore, it is necessary to make the width thicker in upper portion wiring patterns through which large currents flow. Thus, heat transfer from the upper portion wiring pattern can be promoted by placing these thicker portions of the upper portion wiring patterns in contact with the frame 29 that functions as the first heatsink.

Embodiment 4

Figure 10:
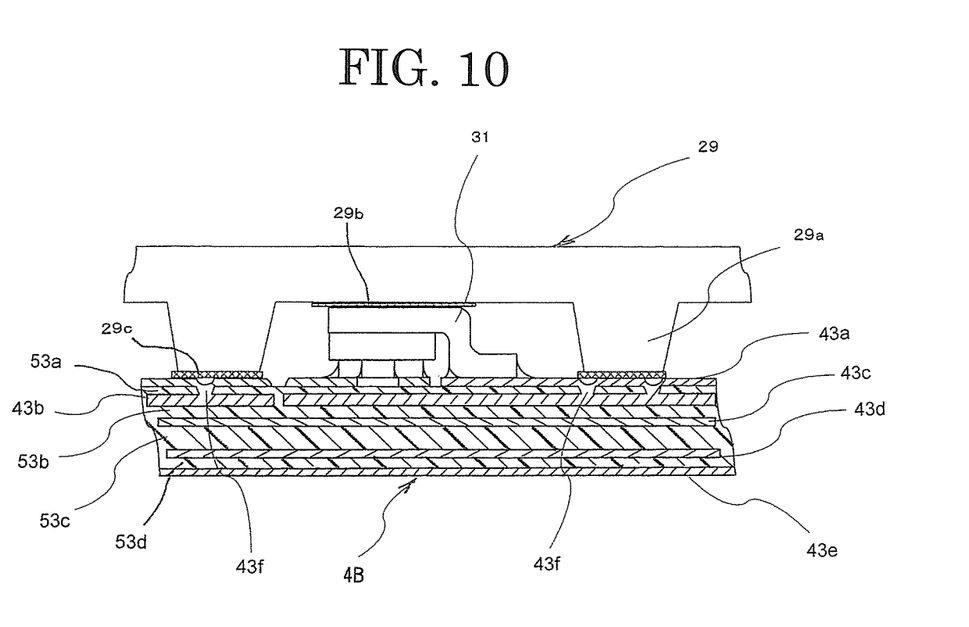
FIG. 10 is a cross section that shows a vicinity of a circuit board in an electronic controlling apparatus according to Embodiment 4 of the present invention.

FIG. 10 is a cross section that shows a vicinity of a circuit board in an electronic controlling apparatus according to Embodiment 4 of the present invention. Moreover, in FIG. 10, only a circuit board is represented in cross section.

In FIG. 10, a circuit board 4B is a multilayered circuit board that is configured by alternately laminating conductor layers 43a, 43b, 43c, 43d, and 43e and insulating layers 53a, 53b, 53c, and 53d. The conductor layers 43a, 43b, 43c, 43d, and 43e are formed using a metal that has good thermal conductivity, such as copper, for example, and the insulating layers 53a, 53b, 53c, and 53d are formed using a composite of glass fiber and epoxy resin, for example. Here, the conductor layer 43a is formed on the front surface of the circuit board 4B, the conductor layers 43b, 43c, and 43d are formed inside the circuit board 4B, and the conductor layer 43e is formed on the rear surface of the circuit board 4B. The conductor layer 43a is patterned into electric power supply wiring patterns 4a and a ground wiring pattern 4b, which constitute an upper portion wiring pattern. The conductor layers 43b, 43c, 43d, and 43e are also patterned into desired wiring patterns. The wiring patterns that are formed by the conductor layers 43a, 43b, 43c, 43d, and 43e are electrically connected by through-holes. Moreover, the conductor layer 43a constitutes an upper portion outer conductor layer, and the conductor layer 43e constitutes a lower portion outer conductor layer. The conductor layer 43b constitutes a first outermost position inner conductor layer, and the conductor layer 43d constitutes a second outermost position inner conductor layer. The lower portion wiring pattern 4c is formed by the conductor layers 43e.

The conductor layer 43b that is disposed at the outermost position in the circuit board 4B is thick, and the conductor layers 43a, 43c, 43d, 43e have identical thicknesses that are thinner than the conductor layer 43b. Switching elements 31 are mounted to the upper portion wiring pattern that is formed by the conductor layer 43a. Upper surfaces of the switching elements 31 contact a frame 29 that functions as a first heatsink so as to have electrically insulating heat-radiating sheets 29b interposed, and the upper portion wiring pattern that is formed by the conductor layer 43a contacts protruding portions 29a of the frame 29 so as to have electrically insulating heat-radiating sheets 29b interposed. An upper portion wiring pattern that is formed by the conductor layer 43a and a wiring pattern that is formed by the conductor layer 43b are connected by vias 43f that are formed at a plurality of positions to improve heat-radiating characteristics.

Here, a switching element 31 has been explained as an example, but the switching elements 5, 32 and 34 are also mounted to the circuit board 4B in a similar manner.

Moreover, a remainder of the configuration is configured in a similar or identical manner to that of Embodiment 2 above.

Because the conductor layer 43b, which has the greatest thickness, is disposed at an outermost position inside the circuit board 4B, and the thicknesses of the rest of the conductor layers 43a, 43c, 43d, and 43e are thinner in this manner, the thicknesses and arrangements of the conductor layers 43a, 43b, 43c, 43d, and 43e are not symmetrical in the thickness direction of the circuit board 4B so as to have a central plane in the thickness direction of the circuit board 4B as a plane of symmetry. Thus, asymmetry in thermal distribution arises due to differences in the thicknesses of the conductor layers 43*a*, 43*b*, 43*c*, 43*d*, and 43*e* when disposed in lamination, making buckling of the circuit board 4B more likely to occur. In Embodiment 4, the thickness of the insulating layer 53*c* between the conductor layers 43*c* and 43*d*, which are adjacent to each other in the thickness direction, is made thicker than the thicknesses of the insulating layers 53*a*, 53*b*, and 53*d* between other conductor layers that are adjacent to each other in the thickness direction. Because of that, thermal stresses that arise as a result of asymmetry in the thermal distribution are absorbed by the insulating layer 53*c* that has increased thickness, suppressing the occurrence of buckling of the circuit board 4B.

Even in the case of a multilayered circuit board in which thicknesses and arrangements of the conductor layers 43*a*, 43*b*, 43*c*, 43*d*, and 43*e* are not symmetrical in the thickness direction of the circuit board 4B so as to have a central plane in the thickness direction of the circuit board 4B as a plane of symmetry in this manner, the occurrence of buckling of the circuit board 4B can be suppressed by increasing the thickness of the insulating layer 53*c* between the conductor layers 43*c* and 43*d*, which are adjacent to each other in the thickness direction.

Moreover, in Embodiment 4 above, the thickness of the conductor layer 43*b* has greatest thickness, but the thickness of the conductor layer 43*a* may have greatest thickness.

In Embodiment 4 above, the conductor layers 43*a*, 43*c*, 43*d*, and 43*e* have identical thicknesses, but the thicknesses of the conductor layers 43*a*, 43*c*, 43*d*, and 43*e* may be different, provided that the thickness of the conductor layer 43*b* has greatest thickness.

In Embodiment 4 above, the thickness of the insulating layer 53*c* is increased, but the thickness of any insulating layer among the insulating layers 53*a*, 53*b*, and 53*d* may be increased. If the thickness of the conductor layer 43*b* has greatest thickness, it is not desirable for the thickness of the insulating layer 53*a* to be increased from a viewpoint of heat-radiating characteristics. The thicknesses of any of the insulating layers 53*a*, 53*b*, 53*c*, and 53*d* may be increased provided that the thickness of the conductor layer 43*a* has greatest thickness.

Embodiment 5

Figure 11:
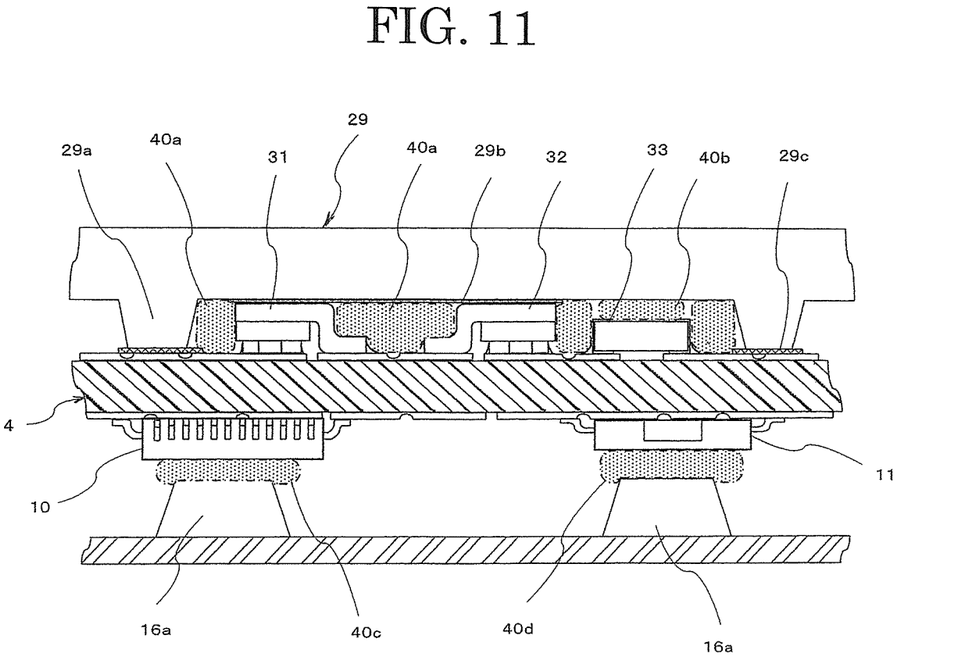
FIG. 11 is a cross section that shows a vicinity of a circuit board in an electronic controlling apparatus according to Embodiment 5 of the present invention.

FIG. 11 is a cross section that shows a vicinity of a circuit board in an electronic controlling apparatus according to Embodiment 5 of the present invention. Moreover, in FIG. 11, a state in which switching elements 31 and 32 and a shunt resistor 33 are mounted to a circuit board 4 is shown.

In FIG. 11, upper surfaces of the switching elements 31 and 32 contact a frame 29 that functions as a first heatsink so as to have electrically insulating heat-radiating sheets 29*b* interposed. An upper portion wiring pattern that is disposed on the front surface of the circuit board 4 contacts protruding portions 29*a* of the frame 29 so as to have electrically insulating heat-radiating sheets 29*c* interposed. A heat-radiating member 40*a* in gel form fills between the frame 29 and the upper portion wiring pattern that is disposed between the switching elements 31 and 32 and the shunt resistors 33. In addition, a heat-radiating member 40*b* in gel form fills between the frame 29 and the shunt resistor 33, which is lower in height than the switching elements 31 and 32.

Heat-radiating members 40*c* and 40*d* in gel form also fill between upper surfaces of a CPU 10 and a driving circuit 11 and projecting portions 16*a* of a housing 16 that functions as a second heatsink. Here, the heat-radiating members 40*a*, 40*b*, 40*c*, and 40*d* are produced into a gel form that has a low fluidity using a silicone resin, for example, to provide thermal conductivity and electrical insulation.

Moreover, a remainder of the configuration is configured in a similar or identical manner to that of Embodiment 1 above.

The switching elements 31 and 32 and the shunt resistor 33 are disposed so as to be in close proximity to each other, making it difficult to dispose the protruding portions 29*a* on the frame 29 so as to contact the upper portion wiring pattern that is disposed between them. In Embodiment 5, because a heat-radiating member 40*a* fills between the frame 29 and the upper portion wiring pattern that is disposed between the switching elements 31 and 32 and the shunt resistors 33, heat generated in the upper portion wiring pattern, which is disposed in a narrow space, can be radiated effectively.

A heat-radiating member 40*b* in gel form fills between the frame 29 and the shunt resistor 33, which is lower in height than the switching elements 31 and 32. Thus, heat generated in the shunt resistor 33 can be easily radiated without having to dispose protruding portions that have different protruding heights on the frame 29.

Heat-radiating members 40*c* and 40*d* in gel form also fill between upper surfaces of a CPU 10 and a driving circuit 11 and projecting portions 16*a* of a housing 16. Thus, heat generated in the CPU 10 and the driving circuit 11 can easily be radiated without having to dispose projecting portions that have different protruding heights on the housing 16.

Because heat-radiating members 40*a*, 40*b*, 40*c*, and 40*d* are produced in a gel form that has low fluidity, heat generated in parts that have different heights can be radiated simply by changing the quantity applied to the surface of a part, without having to change the shape of the frame 29 and the housing 16.

Moreover, in each of the above embodiments, an electric power steering apparatus in which a motor is integrated with a control unit has been explained, but the electric power steering apparatus may have a configuration in which the control unit and the motor are separated.

In each of the above embodiments, a brushless motor has been used, but a motor with brushes may be used. The motor has a stator winding that includes two sets of three-phase alternating-current windings, but the stator winding may be constituted by a single three-phase alternating-current winding. The motor is not limited to a three-phase motor, and may be a motor with a polyphase winding that has more than three phases.

The invention claimed is:

1. An electronic controlling apparatus comprising:
   a circuit board in which conductor layers and insulating layers are disposed alternately;
   a power circuit that comprises a plurality of power elements that are each mounted to a first surface of said circuit board so as to be connected to an upper portion wiring pattern that is formed by an upper portion outer conductor layer that is disposed on said first surface of said circuit board among said conductor layers; and
   a control portion that is mounted to a second surface of said circuit board so as to be connected to a lower portion wiring pattern that is formed by a lower portion outer conductor layer that is disposed on said second surface of said circuit board among said conductor layers,
   wherein:
   said conductor layers lack a central plane in a thickness direction of said circuit board as a plane of symmetry;

a thickness of said upper portion outer conductor layer or of a first outermost position inner conductor layer that is positioned at a position that is nearest to said first surface inside said circuit board among said conductor layers has greatest thickness among said conductor layers; and a thickness of one insulating layer among said insulating layers is thicker than thicknesses of insulating layers remaining among said insulating layers, where a thickness of each of said insulating layers is a thickness of a portion of an insulating layer between conductive layers that are adjacent to each other in a thickness direction of said circuit board.

2. The electronic controlling apparatus according to claim 1, wherein said first outermost position inner conductor layer is connected to said upper portion outer conductor layer by a via.

3. The electronic controlling apparatus according to claim 2, wherein a thermally conductive member fills said via.

4. The electronic controlling apparatus according to claim 1, further comprising a first heatsink that is disposed near said first surface of said circuit board, and that contacts an upper surface of said plurality of power elements.

5. The electronic controlling apparatus according to claim 4, wherein said first heatsink contacts said upper portion wiring pattern.

6. The electronic controlling apparatus according to claim 4, wherein a heat-radiating member in gel form fills between said first heatsink and said upper portion wiring pattern.

7. The electronic controlling apparatus according to claim 1, further comprising: a through-hole that connects said upper portion wiring pattern and a heat-radiating pattern that is formed by said lower portion outer conductor layer; and a second heatsink that is disposed near said second surface of said circuit board, and that contacts said heat-radiating pattern.

8. The electronic controlling apparatus according to claim 1, further comprising a second heatsink that is disposed near said second surface of said circuit board, and that contacts parts that constitute said control portion.

9. The electronic controlling apparatus according to claim 1, wherein said plurality of power elements are disposed on said first surface of said circuit board so as to be distributed uniformly.

10. The electronic controlling apparatus according to claim 1, wherein: said power circuit comprises a first power circuit and a second power circuit that are configured identically; and said power elements that constitute said first power circuit and said power elements that constitute said second power circuit are divided on two opposite sides of a line segment that divides said first surface of said circuit board equally in two, and are disposed symmetrically so as to have said line segment as an axis of symmetry.

11. The electronic controlling apparatus according to claim 10, wherein said control portion outputs controlling variable commands to said first power circuit and said second power circuit so as to be identical.

* * * * *